(12) United States Patent
Ohmi et al.

(10) Patent No.: US 7,968,470 B2
(45) Date of Patent: Jun. 28, 2011

(54) PLASMA NITRIDING METHOD, METHOD FOR MANUFACTURING SEMICONDUCTOR DEVICE AND PLASMA PROCESSING APPARATUS

(75) Inventors: Tadahiro Ohmi, Sendai (JP); Akinobu Teramoto, Sendai (JP); Minoru Honda, Amagasaki (JP); Toshio Nakanishi, Amagasaki (JP)

(73) Assignees: Tohoku University, Sendai-shi (JP); Tokyo Electron Limited, Tokyo (JP)

( * ) Notice: Subject to any disclaimer, the term of this patent is extended or adjusted under 35 U.S.C. 154(b) by 191 days.

(21) Appl. No.: 11/917,013

(22) PCT Filed: Jun. 7, 2006

(86) PCT No.: PCT/JP2006/311397
§ 371 (c)(1),
(2), (4) Date: Dec. 10, 2007

(87) PCT Pub. No.: WO2006/132262
PCT Pub. Date: Dec. 14, 2006

(65) Prior Publication Data
US 2009/0104787 A1    Apr. 23, 2009

(30) Foreign Application Priority Data
Jun. 8, 2005 (JP) .................................. 2005-168094

(51) Int. Cl.
*H01L 21/31* (2006.01)

(52) U.S. Cl. .......... 438/777; 438/21; 438/113; 438/460; 438/701; 257/E21.24; 257/E21.223; 257/E21.597

(58) Field of Classification Search .................. 438/777, 438/275, 778, 791, 21, 113, 460, 701; 257/315, 257/E21.24, E21.223, E21.597
See application file for complete search history.

(56) References Cited

U.S. PATENT DOCUMENTS

| 2002/0004277 A1* | 1/2002 | Ahn et al. ..................... 438/275 |
| 2005/0106896 A1* | 5/2005 | Fukuchi ........................ 438/778 |

FOREIGN PATENT DOCUMENTS

| EP | 1 432 023 | 6/2004 |
| JP | 2000-294550 | 10/2000 |
| JP | 2001-274148 | 10/2001 |
| JP | 2003-115587 | 4/2003 |
| JP | 2003-133232 | 5/2003 |
| JP | 2003-168684 | 6/2003 |
| JP | 2004-193413 | 7/2004 |
| WO | 02/058130 | 7/2002 |

OTHER PUBLICATIONS

Machine language translation of Japan, Publication No. 2004-193,413.*

* cited by examiner

*Primary Examiner* — Jarrett J Stark
*Assistant Examiner* — Wilner Jean Baptiste
(74) *Attorney, Agent, or Firm* — Oblon, Spivak, McClelland, Maier & Neustadt, L.L.P.

(57) ABSTRACT

A nitriding process is performed at a process temperature of 500° C. or more by causing microwave-excited high-density plasma of a nitrogen-containing gas to act on silicon in the surface of a target object, inside a process container of a plasma processing apparatus. The plasma is generated by supplying microwaves into the process container from a planar antenna having a plurality of slots.

11 Claims, 15 Drawing Sheets

PLASMA NITRIDING METHOD, METHOD FOR MANUFACTURING SEMICONDUCTOR DEVICE AND PLASMA PROCESSING APPARATUS

TECHNICAL FIELD

The present invention relates to a plasma nitriding method, a semiconductor device manufacturing method, and a plasma processing apparatus, which are arranged to process, by use of plasma, the surface of a target object such as silicon of a semiconductor substrate or a poly-crystalline silicon layer, amorphous silicon layer, or the like of, e.g., a flat panel display substrate, thereby nitriding silicon and forming a silicon nitride film.

BACKGROUND ART

In the manufacturing processes of various semiconductor devices and TFTs (thin film transistors) of flat panel displays, a silicon nitride film is formed as, e.g., the gate insulating film of a transistor. As a method for forming a silicon nitride film, other than a method for depositing a silicon nitride film by CVD (Chemical Vapor Deposition), there has been proposed a method that forms a silicon oxynitride film by supplying nitrogen to a silicon oxide film by plasma processing, by, e.g., Jpn. Pat. Appln. KOKAI Publication No. 2001-274148.

On the other hand, the film thickness of a gate insulating film is more and more decreasing as micropatterning of semiconductor devices advances. For example, demands have arisen for forming a thin gate insulating film having a film thickness of a few nm. It has become important to maintain a low leakage current and high reliability of a gate insulating film that is thus being more and more thinned. Presently, a silicon oxynitride film (SiON) is used as the material of a gate insulating film. As a method for further lowering the leakage current, however, it is being examined to use a high-k material as a gate insulating film. Also, a silicon nitride film having a higher dielectric constant (7.5) and a lower interface state density, as compared to those of a silicon oxide film, is obtained by directly nitriding silicon by use of plasma of a nitrogen-containing gas. Therefore, it is also being examined to form a silicon nitride film by directly nitriding silicon by use of plasma.

When forming a gate insulating film by directly nitriding silicon by the conventional plasma processing method, if the plasma nitriding process is performed at a temperature of from room temperature to 400° C. (inclusive), good insulating film characteristics become difficult to obtain as follows.

That is, in the actual transistor manufacturing process, processing (e.g., the formation of a poly-crystalline silicon electrode) at a high temperature exceeding 500° C. is performed after a gate insulating film is formed by low-temperature plasma processing. Therefore, the heat applied during this processing varies the insulating film characteristics of the gate insulating film. The present inventors have found that, where the plasma nitriding process is performed at a process temperature of, e.g., 400° C. or less, the amount of intermediate nitride (sub-nitride) existing in the interface ($Si_3N_4$/Si interface) between the silicon nitride film and silicon increases in the later annealing process, thereby varying the characteristics of the gate insulating film. This gate insulating film characteristic variation adversely affects the characteristics of a device such as a transistor, and deteriorates its performance.

Also, a silicon nitride film formed by directly nitriding silicon by plasma at a process temperature of 400° C. or less readily decreases the N-concentration (N-loss) or deteriorates the film quality by oxidation or the like with a lapse of time. In particular, the film quality deteriorates as the film thickness decreases. This makes stable silicon nitride film formation difficult.

DISCLOSURE OF INVENTION

It is an object of the present invention to provide a method capable of forming a thin and high-quality silicon nitride film by directly nitriding silicon by use of plasma.

To solve the problems described above, according to a first aspect of the present invention, there is provided a plasma nitriding method for forming a silicon nitride film, the method comprising:

performing a nitriding process by causing plasma of a nitrogen-containing gas to act on silicon on a surface of a target object, inside a process container of a plasma processing apparatus, wherein the plasma is microwave-excited high-density plasma, and a process temperature of the nitriding process is not less than 500° C.

In the first aspect, the microwave-excited high-density plasma is preferably generated by supplying microwaves into the process container from a planar antenna having a plurality of slots. The process temperature of the nitriding process is preferably 600° C. (inclusive) to 800° C. (inclusive). A process pressure of the nitriding process is preferably not less than 6.7 Pa, and more preferably not less than 20 Pa.

A film thickness of the silicon nitride film is preferably 0.5 to 3 nm. In this case, the silicon nitride film is preferably a gate insulating film. The silicon is preferably one of single-crystalline silicon, poly-crystalline silicon, and amorphous silicon. The silicon is preferably single-crystalline silicon having a substantially (110) surface.

The silicon nitride film may be formed for forming a composite material of the silicon nitride film and a high-k material having a dielectric constant higher than that of the silicon nitride film.

According to a second aspect of the present inventions there is provided a semiconductor device manufacturing method including formation of a gate insulating film containing silicon nitride, the method comprising:

performing a nitriding process by causing plasma of a nitrogen-containing gas to act on silicon on a surface of a target object, inside a process container of a plasma processing apparatus, wherein the plasma is microwave-excited high-density plasma, and a process temperature of the nitriding process is not less than 500° C.

In the second aspect, the method may further comprise performing a heating process at a temperature of not less than 500° C., after the gate insulating film is formed.

According to a third aspect of the present invention, there is provided a control program for execution on a computer, wherein the control program, when executed, controls a plasma processing apparatus to perform a plasma nitriding method for forming a silicon nitride film, the method comprising performing a nitriding process at a process temperature of not less than 500° C. by causing microwave-excited high-density plasma of a nitrogen-containing gas to act on silicon on a target object, inside a process container of the plasma processing apparatus.

According to a fourth aspect of the present invention, there is provided a computer readable storage medium that stores a control program for execution on a computer, wherein the control program, when executed, controls a plasma processing apparatus to perform a plasma nitriding method for forming a silicon nitride film, the method comprising performing a nitriding process at a process temperature of not less than 500° C. by causing microwave-excited high-density plasma of a nitrogen-containing gas to act on silicon on a target object, inside a process container of the plasma processing apparatus.

According to a fifth aspect of the present invention, there is provided a plasma processing apparatus comprising:

a process container including a worktable on which a target object is place d, and configured to be evacuated; and a controller which performs control to perform a plasma nitriding method for forming a silicon nitride film, the method comprising performing a nitriding process at a process temperature of not less than 500° C. by causing microwave-excited high-density plasma of a nitrogen-containing gas to act on silicon on a target object, inside the process container.

The plasma nitriding method of the present invention can form a thin and high-quality silicon nitride film having small damages and defects by performing a plasma nitriding process at a high temperature of 500° C. or more by use of microwave-excited high-density plasma. The silicon nitride film obtained by the method of the present invention has a high heat resistance, does not largely vary the amount of intermediate nitride (sub-nitride) in the $Si_3N_4$/Si interface even when high-temperature processing such as annealing is performed after the film formation, and hardly varies the interface state density. Also, even when the film thickness is as small as, e.g. 3 nm or less, N-loss or oxidation rarely occurs. This makes it possible to stably maintain a high N-concentration. Accordingly, it is possible to suppress the variation in electrical characteristics of a semiconductor device by using the silicon nitride film obtained by the method of the present invention.

The method of the present invention capable of forming a stable nitride film as described above can be advantageously used to form, e.g., a thin gate insulating film about 0.5 to 3 nm thick (preferably, 0.5 to 2 nm thick) of a generation of a 65-nm process node or thereafter in the manufacturing process of a semiconductor device that is being more and more micropatterned.

BEST MODE FOR CARRYING OUT THE INVENTION

Figure 1:
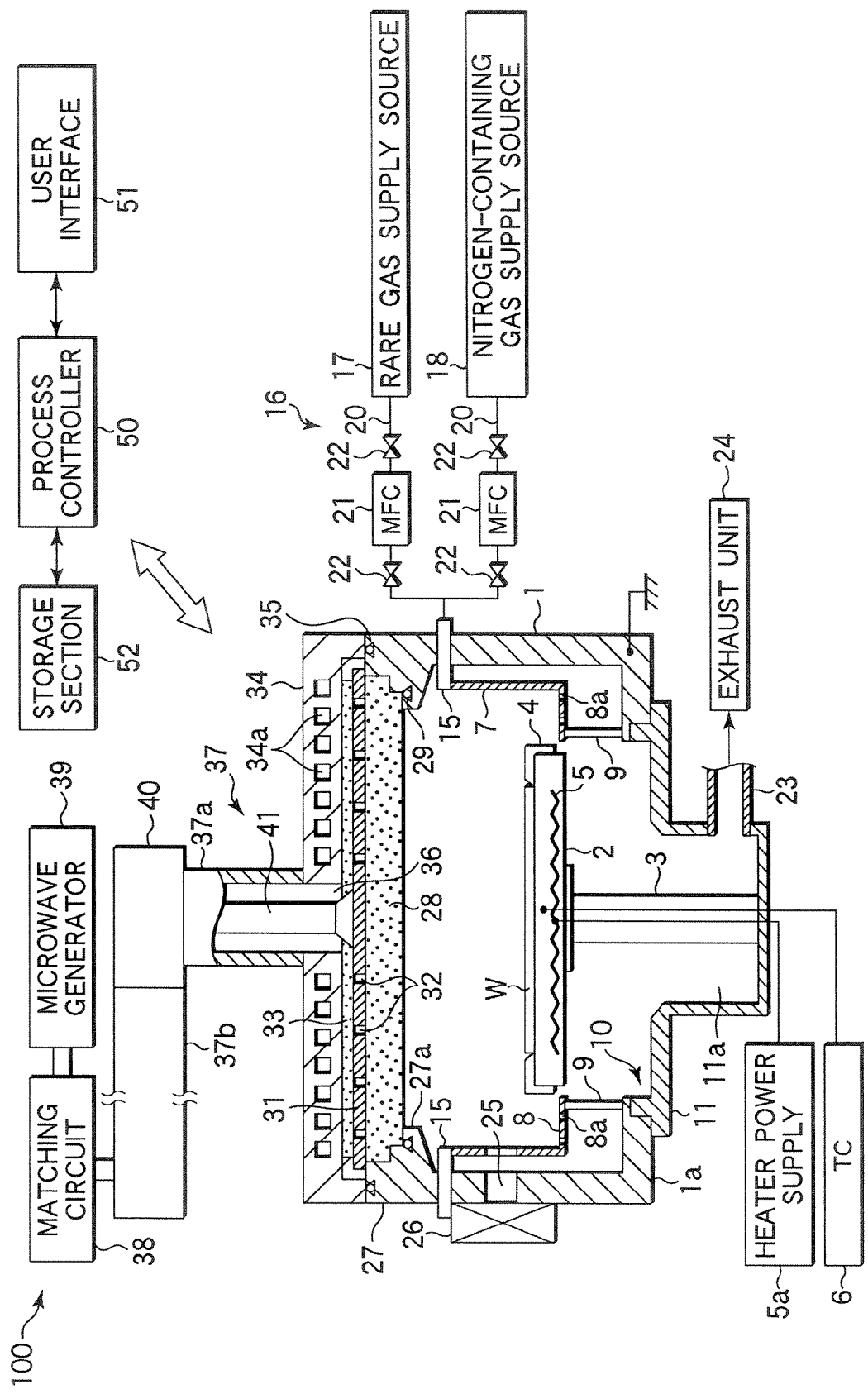
[FIG. 1] This is a schematic sectional view showing an example of a plasma processing apparatus usable in the present invention.

Embodiments of the present invention will be explained in detail below with reference to the accompanying drawing. FIG. 1 is a sectional view schematically showing an example of a plasma processing apparatus preferably usable in the present invention. A plasma processing apparatus 100 is constructed as an RLSA microwave plasma processing apparatus capable generating a high-density, low-electron-temperature, microwave-excited plasma by supplying microwaves into a process chamber from a planar antenna having a plurality of slots, particularly, an RLSA (Radial Line Slot Antenna). The plasma processing apparatus 100 can perform processing by use of plasma having a plasma density of, e.g., $1 \times 10^{10}$ to $5 \times 10^{12}/cm^3$ and an electron temperature of 0.7 to 2 eV.

Accordingly, the plasma processing apparatus 100 is favorably usable to, e.g., form gate insulating films in the manufacturing processes of various semiconductor devices such as a MOS transistor and MOSFET (Field Effect Transistor).

The plasma processing apparatus 100 has an almost cylindrical chamber 1 that is airtightly constructed and grounded. A circular opening 10 is formed in an almost central portion of a bottom wall 1a of the chamber 1. An exhaust chamber 11 protruding downward communicates with the opening 10.

The chamber 1 incorporates a worktable 2 that is made of ceramics such as AlN and horizontally supports a silicon wafer (to be simply referred to as "a wafer" hereinafter) W as a target substrate. The worktable 2 is supported by a cylindrical support member 3 made of ceramics such as AlN and extending upward from the center of the bottom of the exhaust chamber 11. A guide ring 4 for guiding the wafer W is formed on the outer edge of the worktable 2.

A resistance heating type heater 5 is buried in the worktable 2. When receiving power from a heater power supply 5a, the heater 5 heats the worktable 2, thereby heating the wafer W as a target substrate. Also, a thermocouple 6 is connected to the worktable 2. The thermocouple 6 can control the heating temperature of the wafer W within the range of, e.g., room temperature to 900° C. The worktable 2 has wafer support pins (not shown) for supporting and vertically moving the wafer W, such that the wafer support pins can project from and retreat in the surface of the worktable 2.

A cylindrical liner 7 made of quartz is formed around the inner circumferential surface of the chamber 1. The liner 7 prevents metal contamination by the chamber constituting materials. In addition, an annular baffle plate 8 having a larger number of exhaust holes 8a is formed around the outer circumferential surface of the worktable 2, in order to evenly exhaust the chamber 1. The baffle plate 8 is supported by struts 9.

An annular gas supply member 15 is formed in the sidewall of the chamber 1. A gas supply system 16 is connected to the gas supply member 15. Note that the gas supply member may also be a nozzle or shower. The gas supply system 16 has, e.g., a rare gas supply source 17 and nitrogen-containing gas supply source 18. A rare gas and nitrogen-containing gas are supplied to the gas supply member 15 through gas lines 20, and supplied from the gas supply member 15 into the chamber 1. Each gas line 20 has a mass-flow controller 21, and switching valves 22 one on either side of the mass-flow controller 21.

Examples of the nitrogen-containing gas are $N_2$ gas, $NH_3$ gas, a gas mixture of $N_2$ and $H_2$, and hydrazine. Examples of the rare gas are Ar gas, Kr gas, Xe gas, and He gas.

An exhaust pipe 23 is connected to the circumferential surface of the exhaust chamber 11, and an exhaust unit 24 including a high-speed vacuum pump is connected to the exhaust pipe 23. When the exhaust unit 24 is operated, the gas in the chamber 1 is evenly exhausted into a space 11a of the exhaust chamber 11 via the baffle plate 8, and exhausted outside through the exhaust pipe 23. In this manner, the chamber 1 can be rapidly evacuated to a predetermined vacuum degree, e.g., 0.133 Pa.

A transfer port 25 for loading/unloading the wafer W with respect to a transfer chamber (not shown) adjacent to the plasma processing apparatus 100 and a gate valve 26 for opening/closing the transfer port 25 are formed in the sidewall of the chamber 1.

An opening is formed in the upper portion of the chamber 1, and an annular upper plate 27 is fixed to this opening. The lower portion of the inner circumferential surface of the upper plate 27 protrudes into the inside chamber space to form an annular support portion 27a. A microwave transmitting plate 28 is airtightly placed on the support portion 27a with a sealing member 29 between them. The microwave transmitting plate 28 is made of a dielectric material, e.g., quartz or ceramics such as $Al_2O_3$ or AlN, and transmits microwaves. Accordingly, the interior of the chamber 1 is held airtight.

A disk-like planar antenna member 31 is formed on the transmitting plate 28 so as to oppose the worktable 2. The planar antenna member 31 is fixed by the upper end of the sidewall of the chamber 1. The planar antenna member 31 is made of a copper plate or aluminum plate having a gold- or silver-plated surface. A large number of slot-like microwave radiation holes 32 for radiating microwaves are formed into a predetermined pattern through the planar antenna member 31.

Figure 2:
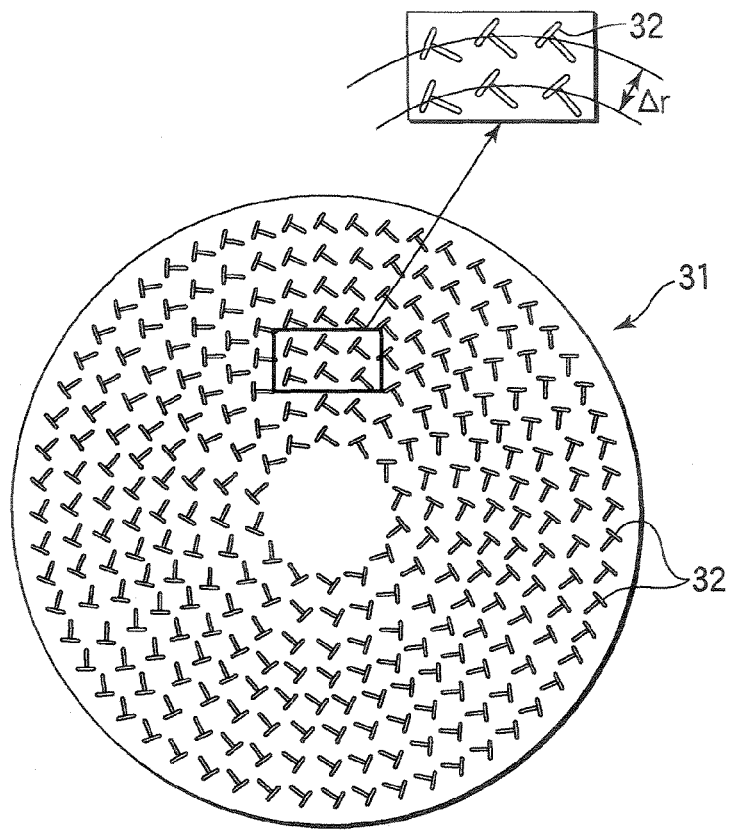
[FIG. 2] This is a view for explaining a planar antenna member.

As shown in FIG. 2, for example, each microwave radiation hole 32 is an elongated slot, and adjacent microwave radiation holes 32 are typically arranged into a "T" shape. Also, a plurality of microwave radiation holes 32 are concentrically arranged. The length and interval of the microwave radiation holes 32 are determined in accordance with the wavelength ($\lambda g$) of microwaves. For example, the microwave radiation holes 32 are arranged such that the interval is $\lambda g/2$ or $\lambda g$. Note that in FIG. 2, $\Delta r$ indicates the interval between concentrically formed adjacent microwave radiation holes 32. The microwave radiation hole 32 may also have another shape such as a circle or circular arc. Furthermore, the arrangement form of the microwave radiation holes 32 is not particularly limited to the concentric shape. For example, the microwave radiation holes 32 may also be spirally or radially arranged.

The upper surface of the planar antenna member 31 has a wave-retardation body 33 having a dielectric constant larger than that in a vacuum. Since the wavelength of microwaves increases in a vacuum, the wave-retardation body 33 has a function of adjusting plasma by shortening the wavelength of microwaves. Note that the planar antenna member 31 and transmitting plate 28 may be brought into tight contact with each other or spaced apart from each other, and the wave-retardation body 33 and planar antenna member 31 may also be brought into tight contact with each other or spaced apart from each other.

A shield lid 34 made of a metal material such as aluminum or stainless steel is formed on the upper surface of the chamber 1 so as to cover the planar antenna member 31 and wave-retardation body 33. A sealing member 35 seals the upper surface of the chamber 1 and the shield lid 34. Cooling water channels 34a are formed in the shield lid 34. The shield lid 34, wave-retardation body 33, planar antenna member 31, and transmitting plate 28 are cooled by supplying cooling water to the cooling water channels 34a. Note that the shield lid 34 is grounded.

An opening 36 is formed in the center of the upper wall of the shield lid 34, and a waveguide tube 37 is connected to this opening. A microwave generator 39 for generating microwaves is connected to the end portion of the waveguide tube 37 via a matching circuit 38. Therefore, microwaves generated by the microwave generator 39 and having a frequency of, e.g., 2.45 GHz are propagated to the planar antenna member 31 through the waveguide tube 37. It is also possible to use, e.g., 8.35 or 1.98 GHz as the frequency of the microwave.

The waveguide tube 37 has a coaxial waveguide tube 37a having a circular sectional shape and extending upward from the opening 36 of the shield lid 34, and a rectangular waveguide tube 37b connected to the upper end portion of the coaxial waveguide tube 37a via a mode transducer 40 and extending in the horizontal direction. The mode transducer 40 between the rectangular waveguide tube 37b and coaxial waveguide tube 37a has a function of converting microwaves propagating in the TE mode in the rectangular waveguide tube 37b into the TEM mode. An inner conductor 41 extends through the center of the coaxial waveguide tube 37a, and the lower end portion of the inner conductor 41 is connected and fixed to the center of the planar antenna member 31. This allows the microwaves to be efficiently evenly propagated in a radial manner to the planar antenna member 31 through the inner conductor 41 in the coaxial waveguide tube 37a.

The components of the plasma processing apparatus 100 are connected to and controlled by a process controller 50 including a CPU. The process controller 50 is connected to a user interface 51 including, e.g., a keyboard on which a process operator inputs commands in order to operate the plasma processing apparatus 100, and a display that visually displays the operation status of the plasma processing apparatus 100.

The process controller 50 is also connected to a storage section 52 storing recipes recording, e.g., control programs (software) for implementing various processes executed by the plasma processing apparatus 100 under the control of the process controller 50, and process condition data.

A required recipe is retrieved from the storage section 52 and executed by the process controller 50 by, e.g., instructions from the user interface 51, thereby performing the desired process of the plasma processing apparatus 100 under the control of the process controller 50. The recipes containing control programs and process condition data may be stored in a computer readable storage medium such as a CD-ROM, hard disk, flexible disk, or flash memory, or transmitted on demand from another apparatus through a dedicated line or the like and used on-line.

The RLSA type plasma processing apparatus 100 constructed as above can form a silicon nitride film by directly nitriding silicon (poly-crystalline silicon or single-crystalline silicon) of the wafer W. The procedure will be explained below.

First, the gate valve 26 is opened, and the wafer W having a silicon surface is loaded into the chamber 1 from the transfer port 25, and placed on the worktable 2. The rare gas supply source 16 and nitrogen-containing gas supply source 18 supply, e.g., Ar gas and $N_2$ gas at predetermined flow rates into the chamber 1 via the gas supply member 15.

More specifically, the flow rate of the rare gas such as Ar or Xe is set at 250 to 2,000 mL/min (sccm), and that of the nitrogen-containing gas such as $N_2$ or $NH_3$ is set at 10 to 500 mL/min (sccm). Also, the interior of the chamber is set at a process pressure of 6.7 to 1,333 Pa (50 mTorr to 10 Torr), preferably, 20 to 400 Pa (150 mTorr to 3 Torr). Furthermore, the temperature of the wafer W is set at 500° C. to 900° C., preferably, 600° C. to 900° C., and more preferably, about 600° C. to 800° C. If the process temperature is less than 500° C., a dense and high-quality silicon nitride film becomes difficult to form as will be described in embodiments later. On the other hand, no remarkable film quality improving effect can be expected even when the nitriding process is performed at a process temperature exceeding 900° C.

Then, microwaves from the microwave generator 39 are supplied to the waveguide tube 37 via the matching circuit 38. The microwaves are sequentially transmitted through the rectangular waveguide tube 37b, mode transducer 40, and coaxial waveguide tube 37a, and supplied to the planar antenna member 31 via the inner conductor 41. The microwaves are radiated from the microwave radiation holes 32 of the planar antenna member 31 to the space above the wafer W in the chamber 1 through the transmitting plate 28. The microwaves are propagated in the TE mode in the rectangular waveguide tube 37b and converted into the TEM mode by the mode transducer 40, and the TEM mode microwaves are propagated in the coaxial waveguide tube 37a toward the planar antenna member 31. The microwave power in this state can be, e.g., 1,000 to 5,000 W.

The microwave radiated from the planar antenna member 31 to the chamber 1 through the transmitting plate 28 forms an electromagnetic field in the chamber 1, thereby generating plasma of Ar gas and $N_2$ gas. Since the microwaves are radiated from many microwave radiation holes 32 of the planar antenna member 31, the microwave plasma has a high density of about $1 \times 10^{10}$ to $5 \times 10^{12}/cm^3$, and has a low electron temperature of about 1.5 eV or less near the wafer W. The microwave-excited plasma thus generated has small plasma damages caused by ions and the like. Then, N is directly introduced into silicon by the action of active species, mainly radicals (N* when $N_2$ gas is used, and NH* when $NH_3$ gas is used) in the plasma, thereby evenly forming an $Si_3N_4$ film on the silicon surface.

In this embodiment, the process temperature (the temperature of the wafer W) is set at 500° C. or more, preferably, 600° C. or more in the plasma nitriding process of forming a silicon nitride film by directly nitriding silicon (poly-crystalline silicon, amorphous silicon, or single-crystalline silicon) by use of plasma in the plasma processing apparatus 100. Even when a heating step is performed at a temperature of, e.g., 500° C. or more after that, therefore, it is possible to suppress the increase in intermediate nitride (sub-nitride) in the interface between $Si_3N_4$ and Si and the increase in interface state density. This makes it possible to form a silicon nitride film ($Si_3N_4$ film) having stable Si—N bonds and capable of stably maintaining the nitrogen concentration.

Figure 3A:
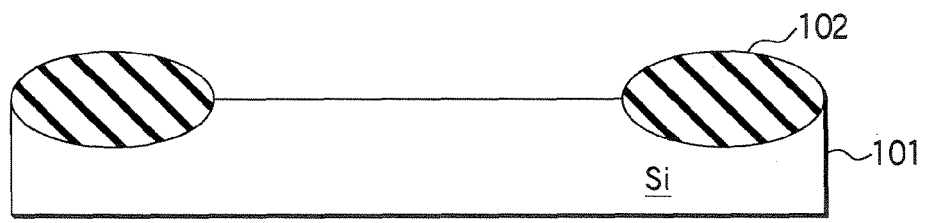
[FIG. 3A] This is a view for explaining the state in which device isolation layers are formed in a transistor manufacturing process.
Figure 3B:
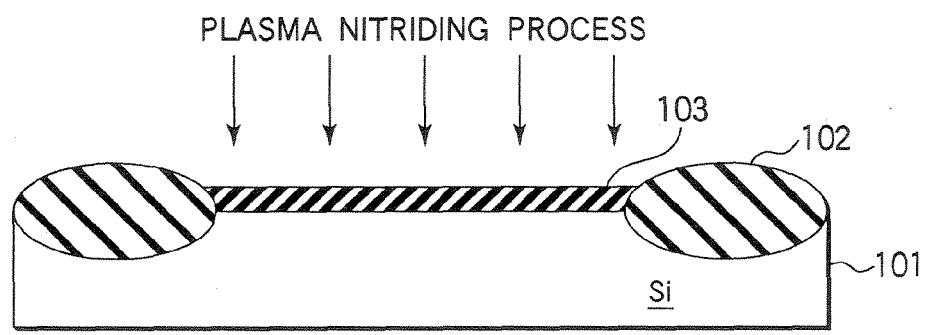
[FIG. 3B] This is a view for explaining the state in which a plasma nitriding process is performed in the transistor manufacturing process.
Figure 3C:
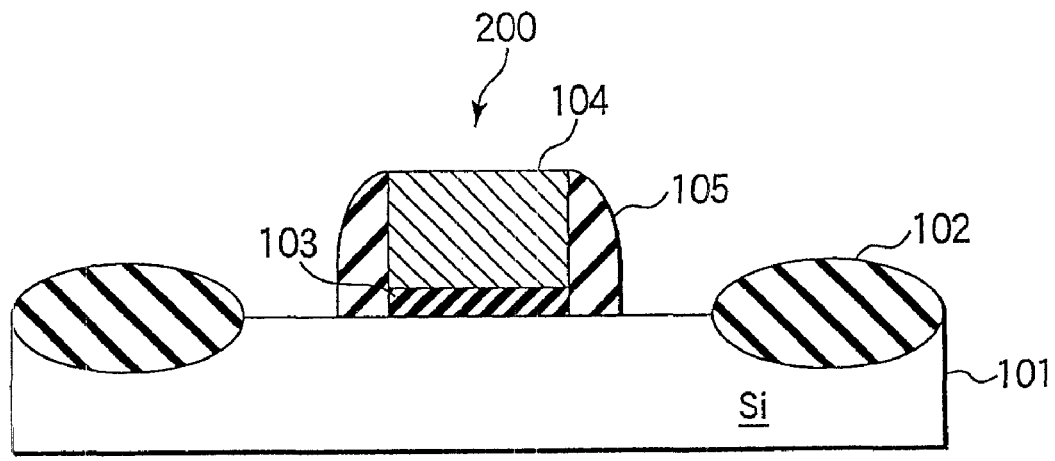
[FIG. 3C] This is a view for explaining the state in which a transistor is formed.

A high-quality silicon nitride film can be formed on the surface of single-crystalline silicon or poly-crystalline silicon as described above. Accordingly, the plasma nitriding method of the present invention can be used when forming a silicon nitride film as a gate insulating film in the manufacture of various semiconductor devices such as a transistor. As a preferred manner, the plasma nitriding method of the present invention is particularly useful in the formation of a gate insulating film having a film thickness of, e.g., 3 nm or less, preferably, 0.5 to 2 nm. FIGS. 3A to 3C are views for explaining an example in which the plasma nitriding method of the present invention is applied to the manufacturing process of a transistor.

As shown in FIG. 3A, a well (not shown) is formed in a p- or n-type Si substrate 101, and device isolation layers 102 are formed by LOCOS or the like. Note that the device isolation layers 102 may also be formed by STI (Shallow Trench Isolation).

Then, as shown in FIG. 3B, a gate insulating film 103 (an $Si_3N_4$ film) is formed on the surface of the Si substrate 101 by performing plasma nitriding process, as described above. Although the film thickness of the gate insulating film 103 changes in accordance with the target device, the film thickness is, e.g. 0.5 to 3 nm, preferably, about 0.5 to 2 nm. Note that after the formation of the gate insulating film 103, it is also possible to perform an annealing process subsequently to nitriding, by heating in an inert gas atmosphere at a temperature of, e.g., 800° C. to 1,100° C. for about 10 to 60 min.

Subsequently, a poly-crystalline silicon layer 104 is formed on the gate insulating film 103 by CVD at a temperature exceeding, e.g., 400° C., and etched by photolithography, thereby forming a gate electrode. Note that the gate electrode structure is not limited to a single layer of the poly-crystalline silicon layer 104. To decrease the resistivity of the gate electrode and increase the operating speed, it is also possible to form a stacked structure containing, e.g., tungsten, molybdenum, tantalum, titanium, cobalt, nickel, or a silicide, nitride, alloy, or the like of any of these metals. After the gate electrode is thus formed, a transistor 200 having a MOS structure can be manufactured as shown in FIG. 3C by forming a source and drain (not shown) by ion implantation and an activation process, and forming sidewalls 105 by insulating films.

Next, an explanation will be given of the results of experiments as the basis of the present invention.

A silicon nitride film having an optical film thickness of 1.5 nm was formed by directly nitriding the Si (100) surface in a processing apparatus 100 having the same configuration as shown in FIG. 1. In this plasma nitriding process, Xe and $NH_3$ were used as process gases at flow rate ratio $Xe/NH_3=1,000/100$ mL/min (sccm), and the process pressure was set at 6.7 Pa (50 mTorr). The process temperature was 400° C. to 600° C. as the wafer temperature, the microwave frequency was 2.45 GHz, and the microwave power was 5 W/cm$^2$.

In addition, another sample was prepared by performing annealing in an $N_2$ atmosphere at 600° C. for 30 min after a film was formed under the above conditions.

The Si $2p^{3/2}$ spectra of the obtained silicon nitride films were measured by using an Al Kα line-excited, high-sensitivity, high-resolution X-ray photoelectron spectroscope (ESCA-300). This X-ray photoelectron spectral measurement was performed at an energy resolution of 100 meV by using an Si 2p photoelectron spectrum excited by 1,050-eV photons in a soft X-ray beam line BU27SU of SPring8.

Note that the Si $2p^{3/2}$ spectrum was obtained by removing a background noise from the Si 2p photoelectron spectrum by using the method of Tougard, and separating the spectrum into Si $2p^{1/2}$ and Si $2p^{3/2}$ [K. Ohishi et al., Jpn. J. Appl. Phys. 33 (1994)L675]. In this spectral separation, it was assumed that the splitting energy of the Si 2p inner-shell level caused by the spin orbital interaction was 0.608 eV, and the Si $2p^{1/2}$ spectral intensity was ½ that of the Si $2p^{3/2}$ spectrum [F. J. Himpsel et al., Phys. Rev B38 (1988)6084]. It was also assumed that the intermediate nitride (sub-nitride) was made of only $Si^{1+}$, $Si^{2+}$, and $Si^{3+}$ in a silicon oxide film in accordance with the sub-oxide defined by Hollinger et al. [G. Hollinger et al., Appl. Phys. Lett. 44 (1984)93].

Table 1 shows the binding energy, half-width, and amount (ML) of the intermediate nitride ($Si^{n+}$) when the film was formed at 600° C.

The amount (ML) of each intermediate nitride $Si^{n+}$ n=1 to 3) was obtained by the following method as a method by which the influence of the film thickness of the nitride film can be ignored.

That is, after spin separation, the spectral intensity ($NSi^{n+}$) of each intermediate nitride was obtained. After that, the amount of each intermediate nitride was obtained from the spectral intensity ($NSi^{n+}/NS=Nt·t/Ns\Lambda s·\sin 0$) of the intermediate nitride normalized with respect to the spectral intensity (NS) of the Si substrate. Note that the silicon atomic density (Ns) was $5\times10^{22}$ cm$^{-2}$, the silicon electron escape depth (Λs) was 1.59 nm, and the take-off angle was 52°. Note also that the amount of each intermediate nitride was obtained by assuming that 1 mL was a silicon surface atomic density of $6.8\times10^{14}$ cm$^{-2}$ [M. Shioji et al., Appl. Phys. Lett. 89, 3756 (2004)].

TABLE 1

| Sub-nitride type | $Si^{0+}$ | $Si^{1+}$ | $Si^{2+}$ | $Si^{3+}$ | $Si^{4+}$ |
|---|---|---|---|---|---|
| Chemical shift [eV] | — | 0.684 | 1.210 | 1.940 | 2.458 |
| Half-width [eV] | 0.396 | 0.538 | 0.698 | 0.820 | 0.944 |
| Sub-nitride amount [ML] | — | 0.577 | 0.374 | 0.340 | — |
| | (1.29 ML in total) | | | | |

From Table 1, it is understood that the total amount of sub-nitrides was 1.29 mL, and a steep composition change occurred in the $Si_3N_4$/Si interface.

Subsequently, a MIS capacitor was formed by using the silicon nitride film formed under the above conditions as a gate insulating film. The electrical characteristics of the gate insulating film were evaluated by measuring the C-V curve of this MIS capacitor. The capacitor was formed as follows.

First, a field oxide film was formed by wet oxidation (1,100° C.) for device isolation. After patterning a an active region was separated by a solution mixture (HCl/HF=19/1) of HCl and HF. After that, five-step cleaning was performed in order to prevent an increase in surface roughness. This five-step cleaning includes first to fifth steps below performed at room temperature.

First Step:

Organic contaminants are removed by cleaning using ozone-dissolved ultrapure water. Metal contaminants can also be partially removed.

Second Step:

Megasonic irradiation is performed using a cleaning solution prepared by dissolving a surfactant and $H_2$ in FPM (a hydrofluoric acid/hydrogen peroxide solution; $HF/H_2O_2$), thereby removing fine particles, metals, and oxides.

Third Step:

Organic materials and compound residues are removed by cleaning using ozone-dissolved ultrapure water and megasonic irradiation.

Fourth Step:

Oxides are removed and hydrogen termination is accelerated by cleaning using FPM.

Fifth Step:

Rinsing is performed by hydrogen-dissolved pure water and megasonic irradiation.

The above steps made the micro-roughness (Ra) of the silicon surface about 0.08 nm. Immediately after that, a silicon nitride film was formed under the above conditions by using the plasma processing apparatus 100. Subsequently, an Al electrode was formed as a gate electrode by vapor deposition and patterned, thereby obtaining a MIS capacitor.

Figure 4:
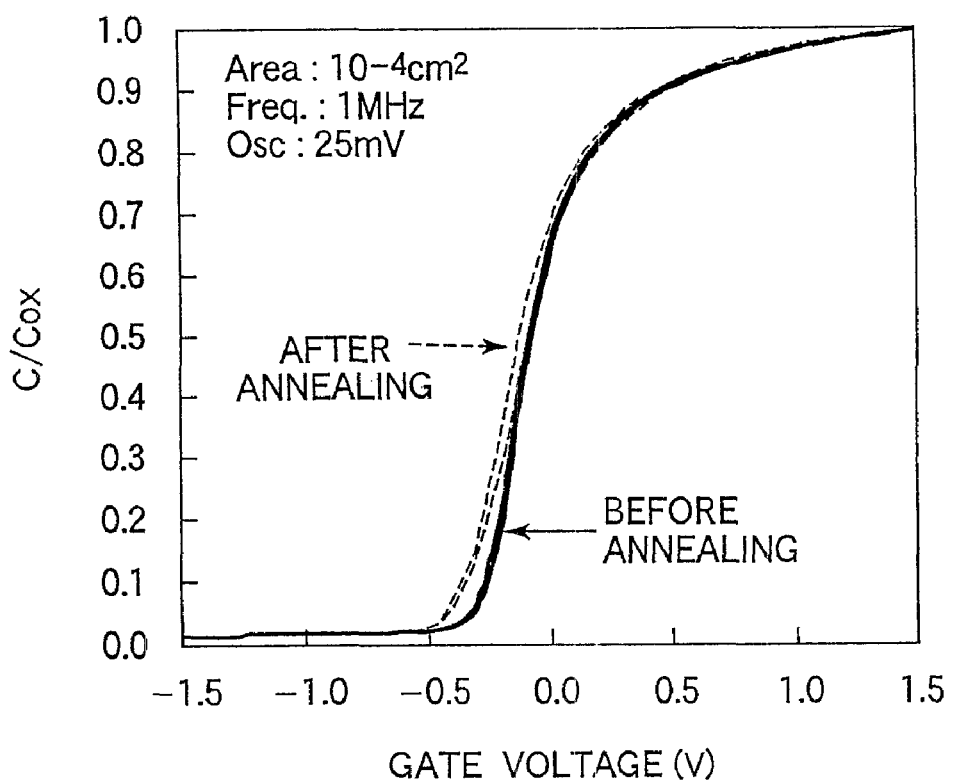
[FIG. 4] This is a graph showing the C-V curves of MIS capacitors using silicon nitride films formed at 600° C.
Figure 5:
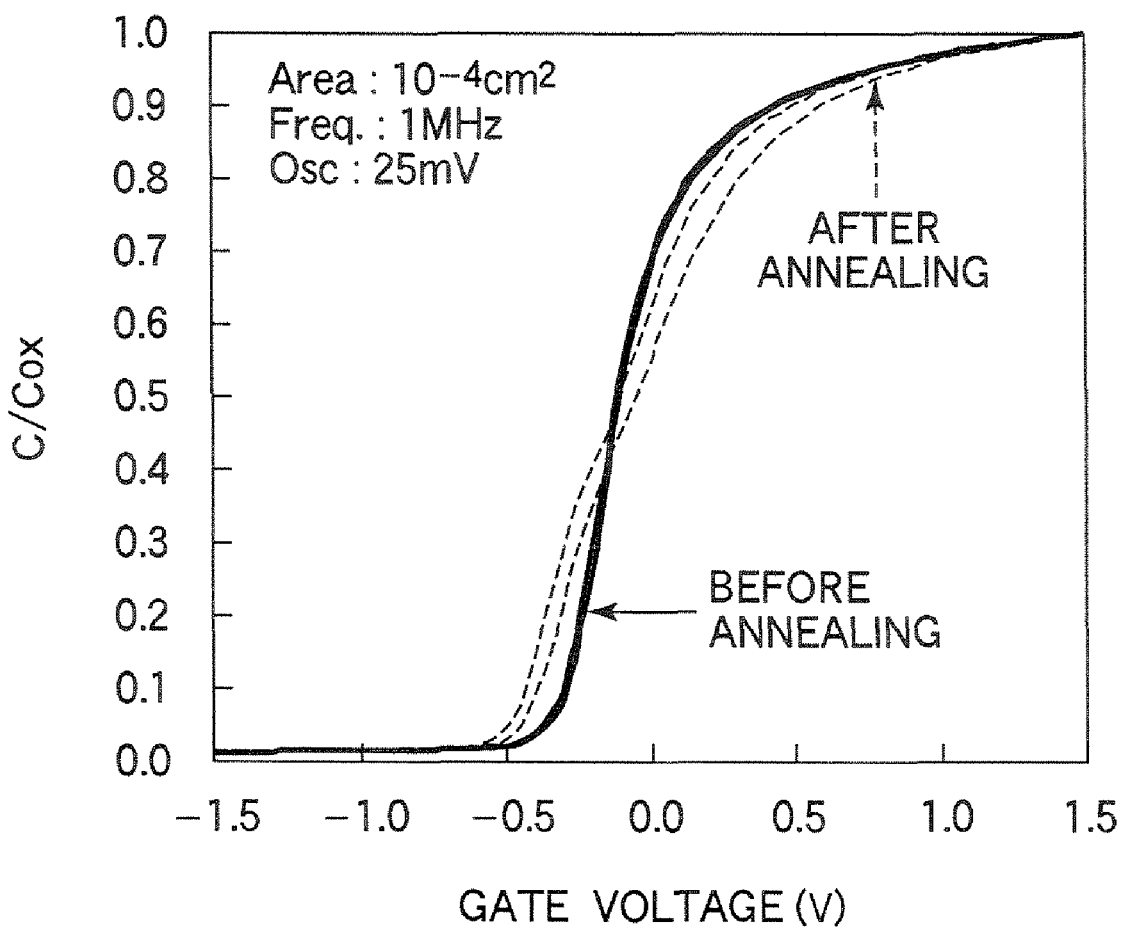
[FIG. 5] This is a graph showing the C-V curves of MIS capacitors using silicon nitride films formed at 400° C.

FIG. 4 shows the C-V curves of samples obtained at 600° C. when annealing was performed under the above conditions and no annealing was performed. FIG. 5 shows the C-V curves of samples obtained at 400° C. when annealing was performed under the above conditions and no annealing was performed. Note that the ordinate in each of FIGS. 4 and 5 indicates a value obtained by dividing the measured electrical capacitance by its maximum value, and normalizing the result.

FIGS. 4 and 5 demonstrate that no hysteresis was observed when no annealing was performed regardless of the film formation temperature. When annealing was performed, however, no hysteresis was observed in the sample formed at 600° C., whereas a hysteresis was observed in the sample formed at 40020 C. This shows that annealing increased the interface state density in the sample formed at 400° C. On the other hand, almost no increase was found in the interface state density in the sample formed at 600° C.

The above results reveal that, where directly nitriding silicon by the plasma processing apparatus 100, a silicon nitride film electrically stable with respect to annealing after film formation can be formed by setting the process temperature of film formation at a high temperature (500° C. or more, preferably, 600° C. or more).

Figure 6:
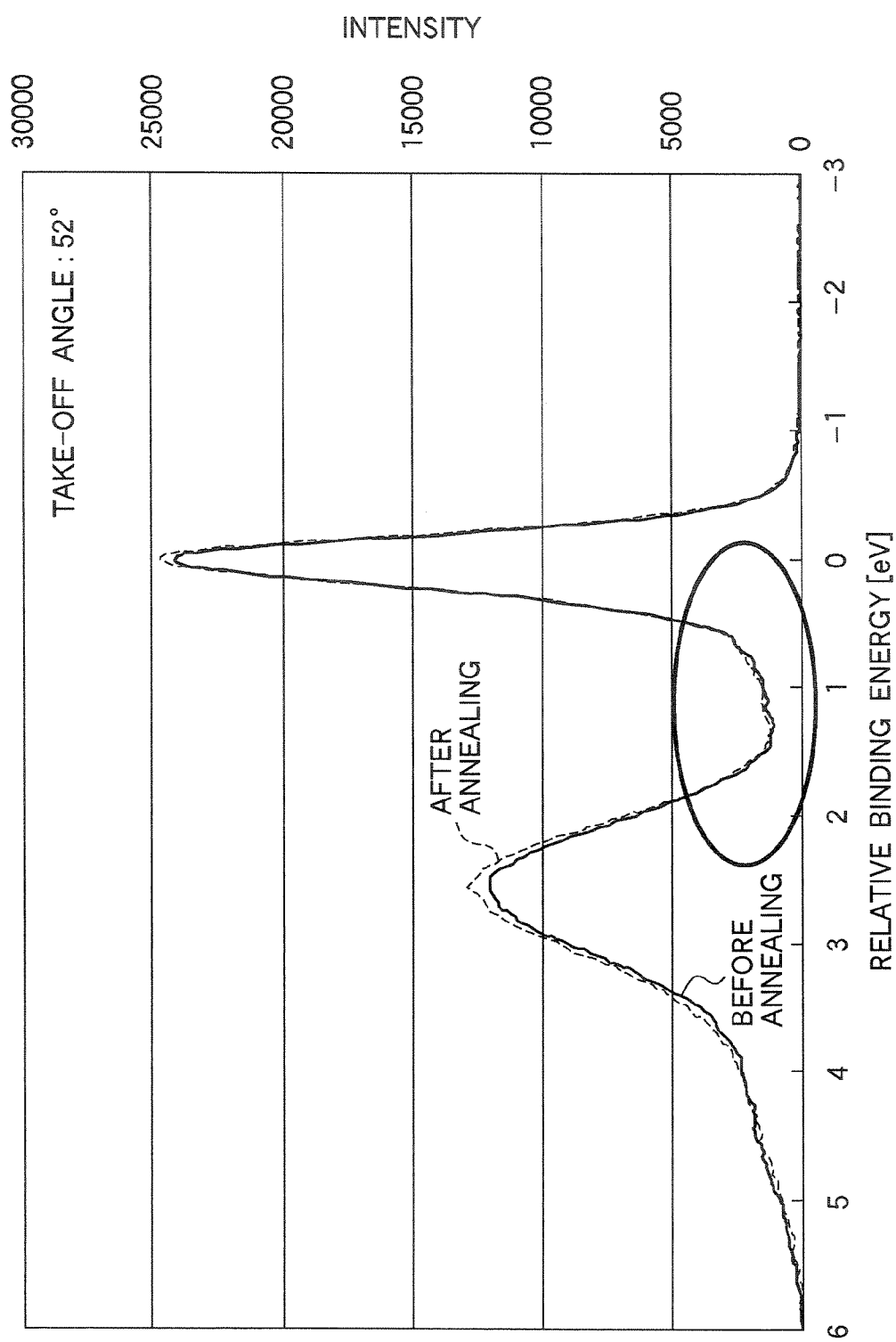
[FIG. 6] This is a graph showing the Si $2p^{3/2}$ spectra of silicon nitride films formed at 600° C.
Figure 7:
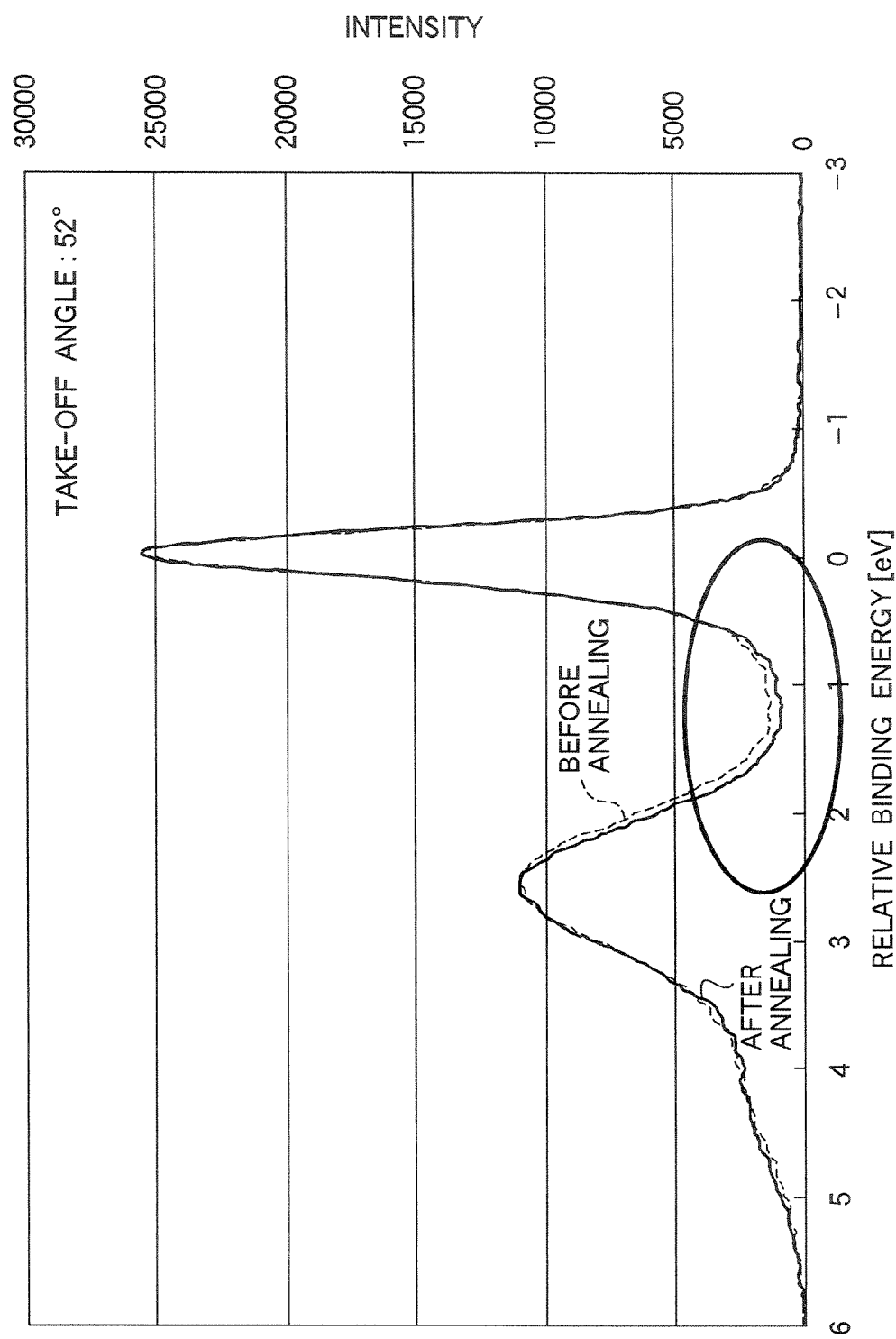
[FIG. 7] This is a graph showing the Si $2p^{3/2}$ spectra of silicon nitride films formed at 400° C.

FIGS. 6 and 7 show Si $2p^{3/2}$ spectra measured by the above method. That is, FIG. 6 shows two spectra (at a take-off angle of 52°) when film formation (nitriding) was performed at 600° C., and when annealing was additionally performed at 600° C. after film formation. FIG. 7 shows two spectra (at a take-off angle of 52°) when film formation (nitriding) was performed at 400° C., and when annealing was additionally performed at 600° C. after film formation.

FIG. 6 indicates that the amount of sub-nitride (a portion indicated by the ellipse in FIG. 6) as the intermediate nitride of the silicon nitride film formed at 600° C. remained unchanged even when annealing was performed later at 600° C. As shown in FIG. 7, however, in the silicon nitride film formed at 400° C., the amount of sub-nitride (a portion indicated by the ellipse in FIG. 7) increased when annealing was performed later at 600° C.

Figure 8:
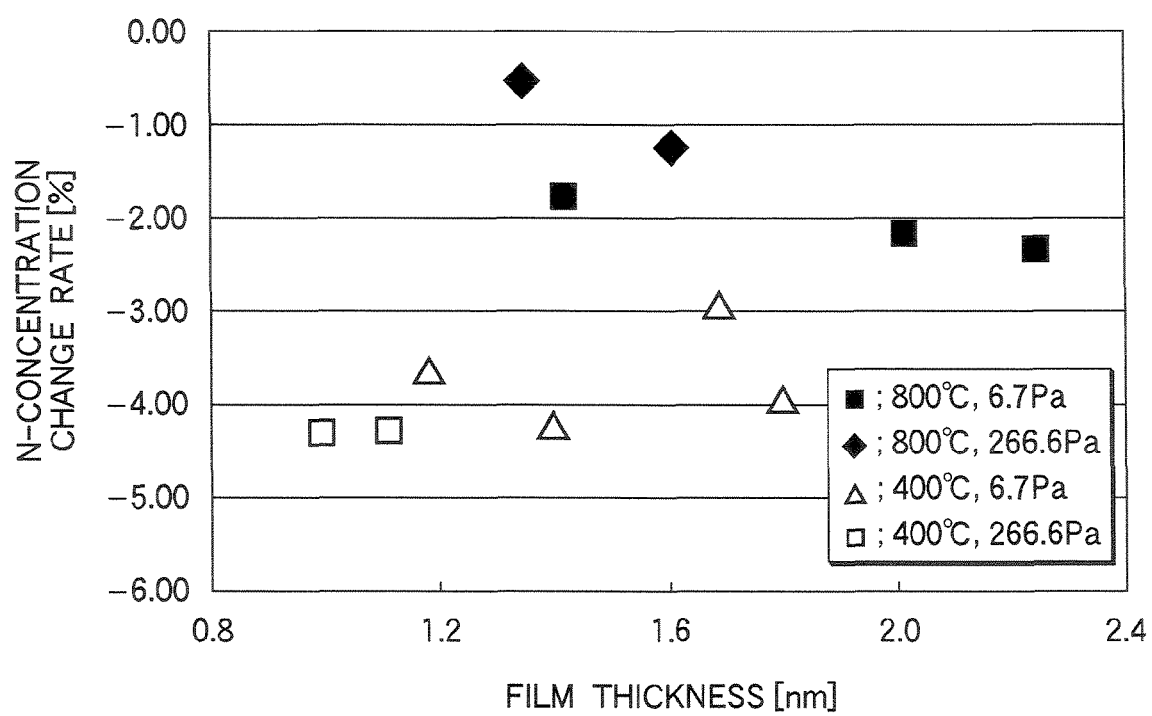
[FIG. 8] This is a graph plotting the change rate of the N-concentration in a film for each of different film thicknesses.

Then, a silicon nitride film was formed by directly nitriding an Si substrate by using the plasma processing apparatus 100, and the N-concentration in the film was measured by X-ray photoelectron spectroscopy (XPS analysis). FIG. 8 plots the change rate ($\Delta N$) of the N-concentration from three hours to 24 hours after the plasma nitriding process, for each of different film thicknesses.

The plasma conditions of the nitriding process were that $Ar/N_2$ gas was used as a process gas at a flow rate of 1,000/40 mL/min (sccm), and the wafer temperature was set at 400° C. or 800° C. Also, the pressure was 6.7 Pa or 266.6 Pa (50 mTorr or 2,000 mTorr), the power supplied to the plasma was 1.5 kW, and the process time was 10 to 60 sec. Note that the wafer W was cleaned with 1% dilute hydrofluoric acid (DHF) solution before being used.

FIG. 8 demonstrates that N-loss in low-temperature processing at 400° C. was obviously larger than that in high-temperature processing at 800° C. regardless of the process pressure and film thickness. This indicates that a stable, dense nitride film having a small N-loss can be formed by performing processing at a high temperature of 800° C. by using the plasma processing apparatus 100.

Figure 9:
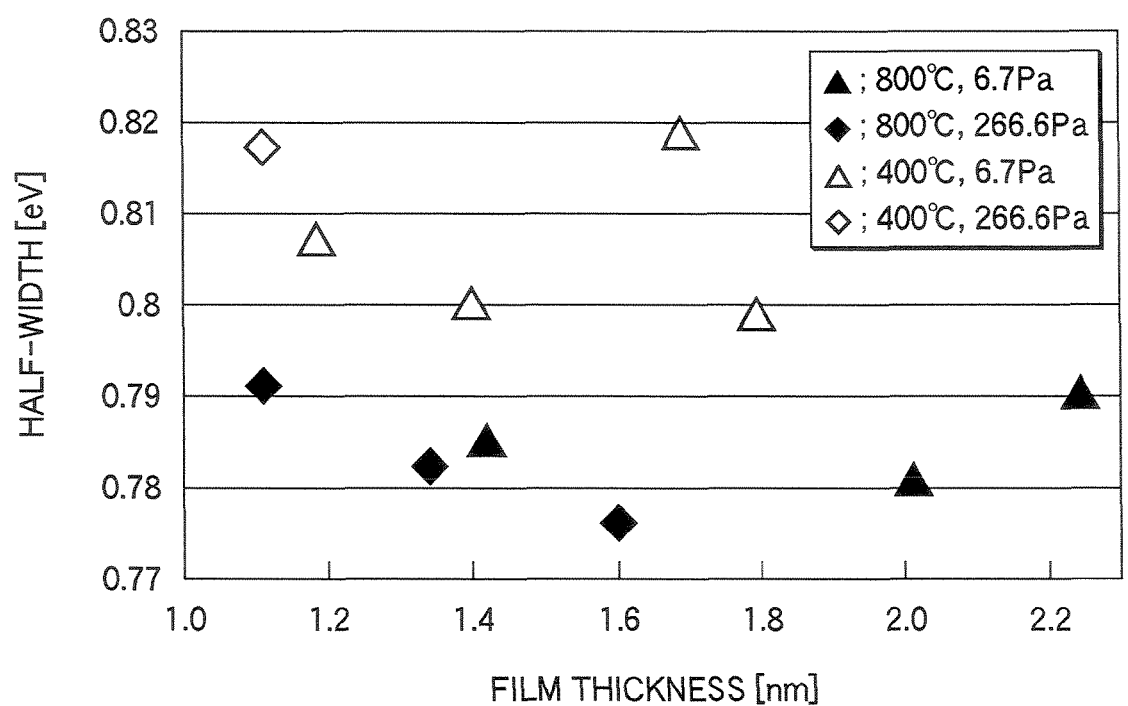
[FIG. 9] This is a graph plotting the half-width of the N1s spectrum of a silicon nitride film for each of different film thicknesses.

In addition, the N1s spectrum of the formed silicon nitride film was measured by X-ray photoelectron spectroscopy (XPS analysis), and the half-width of the spectrum was obtained. FIG. 9 shows the results. FIG. 9 reveals that the half-width obtained by the low-temperature processing at 400° C. was evidently larger than that obtained by the high-temperature processing at 800° C. regardless of the process pressure and film thickness. That is, the process temperature difference produced a half-width difference; the half-width was smaller and the peak of the N1s spectrum was sharper in the high-temperature processing at 800° C.

Figure 10:
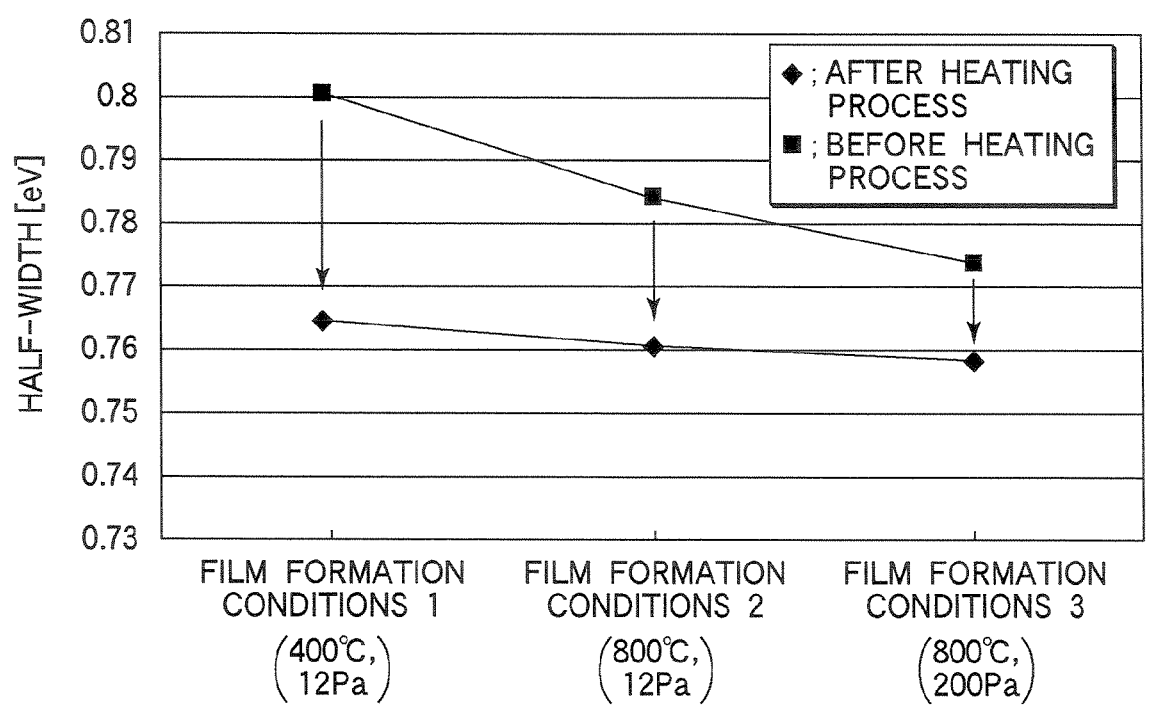
[FIG. 10] This is a graph showing the relationship between the half-width of the N1s spectrum of a silicon nitride film and the film formation conditions.

Subsequently, silicon nitride films were formed by directly nitriding Si substrates under film formation conditions 1 to 3 below by using the plasma processing apparatus 100. After that, each silicon nitride film was heated in an oxidizing atmosphere described below. The peak of the N1s spectrum of each silicon nitride film was measured by X-ray photoelectron spectroscopy (XPS analysis), and the half-width of the peak was obtained. FIG. 10 shows the results.

(Film Formation Conditions 1)
Process gas flow rate; $Ar/N_2$ gas=1,000/200 mL/min (sccm)
Pressure; 12 Pa (90 mTorr)
Microwave power; 1.5 kW
Wafer temperature; 400° C.
Process time; 200 sec (Film Formation Conditions 2)
Process gas flow rate; $Ar/N_2$ gas=1,000/200 mL/min (sccm)
Pressure; 12 Pa (90 mTorr)
Microwave power; 1.5 kW
Wafer temperature; 800° C.
Process time; 30 sec (Film Formation Conditions 3)
Process gas flow rate; $Ar/N_2$ gas=1,000/200 mL/min (sccm)
Pressure; 200 Pa (1,500 mTorr)
Microwave power; 1.5 kW
Wafer temperature; 800° C.
Process time; 180 sec Note that the wafer W was cleaned with 1% dilute hydrofluoric acid (DHF) solution before being used.

Note also that after the processing was performed under any of the above film formation conditions, annealing was performed for 15 sec in a high-temperature oxidizing atmosphere at a pressure of 999.8 Pa (75 Torr), an $O_2$ flow rate of 2 L/min (slm), and a heating temperature of 1,000° C.

FIG. 10 shows that the half-width of the peak of the N1s spectrum decreased in the order of the low-temperature nitriding process (film formation conditions 1) at a pressure of 12 Pa and 400° C., the high-temperature nitriding process (film formation conditions 2) at a pressure of 12 Pa and 800° C., and the high-temperature nitriding process (film formation conditions 3) at a pressure of 200 Pa and 800° C. This indicates that the peak of the N1s spectrum was sharper in the silicon nitride film formed by the high-temperature nitriding process than in the silicon nitride film formed by the low-temperature nitriding process. This tendency increased when the heating process was performed in the high-temperature oxidizing atmosphere after the plasma nitriding process. That is, in the plasma nitriding process at a low temperature of 400° C. (film formation conditions 1), the half-width largely changed due to the later heating process in the oxidizing atmosphere. However, in the plasma nitriding processes at a high temperature of 800° C. (film formation conditions 2 and 3), the change amounts of the half-widths were smaller than that in the low-temperature processing at 400° C.

Figure 11:
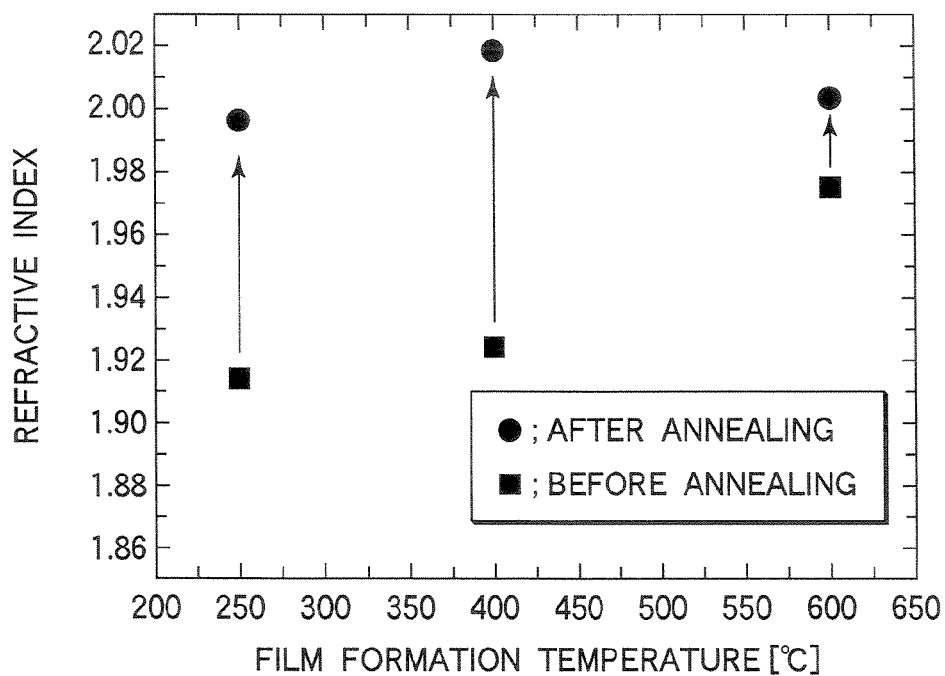
[FIG. 11] This is a graph showing the film formation temperature and the refractive indices of silicon nitride films before and after annealing.

FIG. 11 shows the variations in refractive indices before and after annealing of silicon nitride films formed at 250° C., 400° C., and 600° C. by using the plasma processing apparatus 100 shown in FIG. 1. The film formation conditions were that Xe and $NH_3$ were used as process gases, the flow rate ratio $Xe/NH_3$ was 1,000/100 mL/min (sccm), the pressure was 6.7 Pa (50 mTorr), and the microwave power was 700 W. Also, the silicon nitride film formed at each temperature was annealed at 600° C. in an $N_2$ atmosphere for 30 min.

FIG. 11 reveals that a high-density silicon nitride film having a high refractive index is obtained by raising the film formation temperature. In addition, when annealing was performed after film formation, the variation in refractive index was small in a sample formed at 600° C. By contrast, the variation width of the refractive index was large in a sample formed at 250° C. or 400° C. This indicates that no dense silicon nitride film was formed before annealing.

The results shown in FIGS. 8 to 11 described above demonstrate that, where the plasma nitriding process is performed at a high temperature of 500° C. or more, it is possible to form a hardly oxidizable, dense, stable nitride film having little N-loss and small variations in film characteristics.

Then, silicon nitride films were formed on silicon substrates under the following nitriding conditions, MISFETs for evaluation using these silicon nitride films as gate insulating films were manufactured, and the electrical characteristics of the MISFETs were measured. Each MISFET for evaluation had a gate structure in which the silicon nitride film as a gate insulating film was formed on the silicon substrate, and a poly-crystalline silicon electrode was formed on the silicon nitride film. The channel width (W) was 20 µm, and the gate length was 5.8 µm.

<Nitriding Conditions>

Silicon nitride films were formed by directly nitriding the Si (100) surface and Si (110) surface by using the plasma processing apparatus 100 having the same arrangement as shown in FIG. 1. In this plasma nitriding process, Xe and $NH_3$ were used as process gases at flow rate ratio $Xe/NH_3=1{,}000/100$ mL/min (sccm), and the process pressure was set at 20 Pa (150 mTorr). The process temperature was 600° C. as the wafer temperature, the microwave frequency was 2.45 GHz, and the microwave power was 5 W/cm². The EOT (Equivalent Oxide Thickness; the film thickness converted into that of an $SiO_2$ film) of the silicon nitride film on the Si (100) surface was 2.06 nm, and that of the silicon nitride film on the Si (110) surface was 1.70 nm.

Figure 12A:
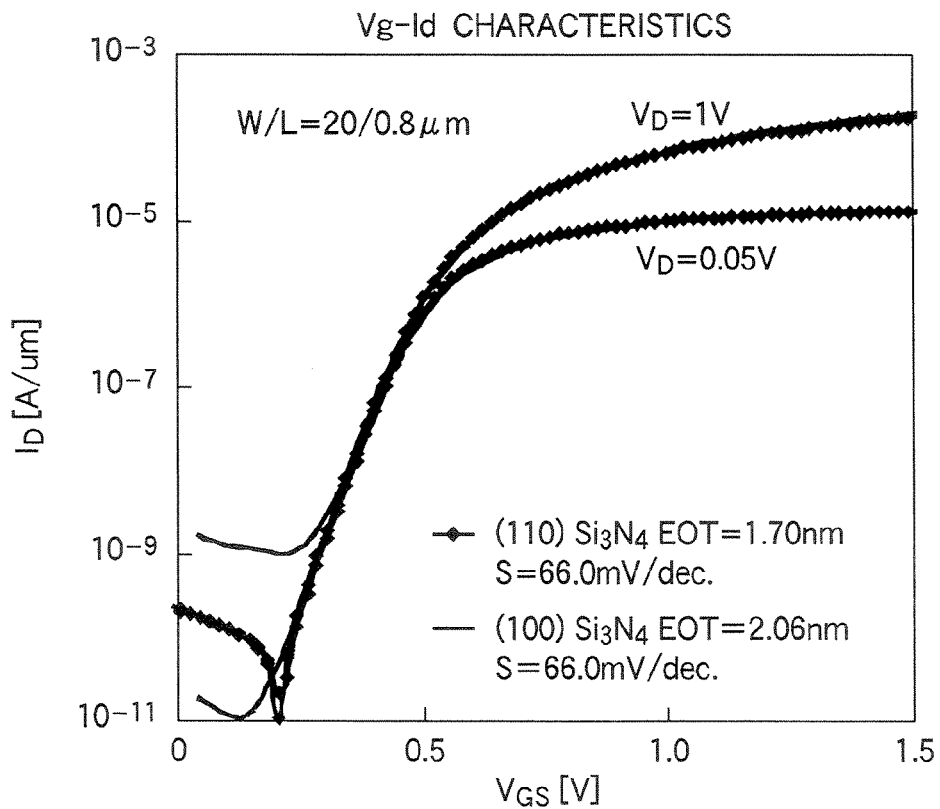
[FIG. 12A] This is a graph showing the $V_G$-$I_D$ characteristics of MISFETs for evaluation.
Figure 12B:
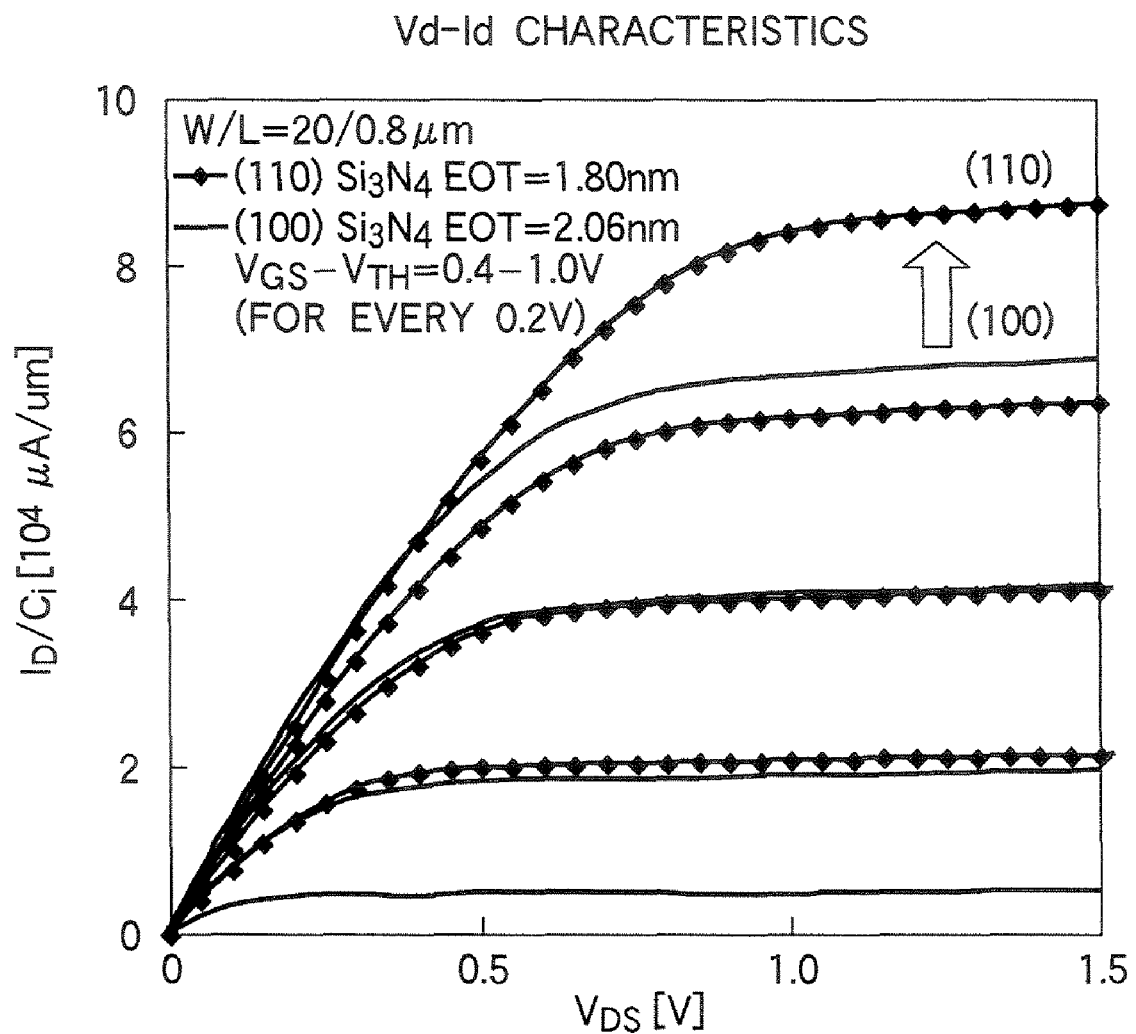
[FIG. 12B] This is a graph showing the $V_D$-$I_D$ characteristics of the MISFETs for evaluation.

FIGS. 12A and 12B are graphs showing the $V_G$-$I_D$ characteristics and $V_D$-$I_D$ characteristics obtained by measuring the gate voltages ($V_G$) and drain currents ($I_D$) of a MISFET (to be referred to as "MISFET-110" hereinafter) for evaluation using the silicon nitride film on the Si (100) surface as a gate insulating film and a MISFET (to be referred to as "MISFET-100" hereinafter) for evaluation using the silicon nitride film on the Si (110) surface as a gate insulating film. Note that the S-factors of these MISFETs were 66.0 mV/dec.

FIG. 12A shows that on the low-voltage side where the voltage was 0.2 to 0.3 (inclusive) V, the drain current ($I_D$) and leakage current of MISFET-110 were smaller than those of MISFET-100 regardless of whether the drain voltage ($V_D$) was 0.05 or 1 V. FIG. 12B shows the $V_D$-$I_D$ characteristics when $V_{GS}$-$V_{TH}$ was 0.4, 0.6, 0.8, and 1.0 V. As shown in FIG. 12B, the drain current ($I_D$) of MISFET-110 was larger than that of MISFET-100 regardless of the value of $V_{GS}$-$V_{TH}$. The above results reveal that MISFET-110 was superior to MISFET-100 in electrical characteristics.

Figure 13:
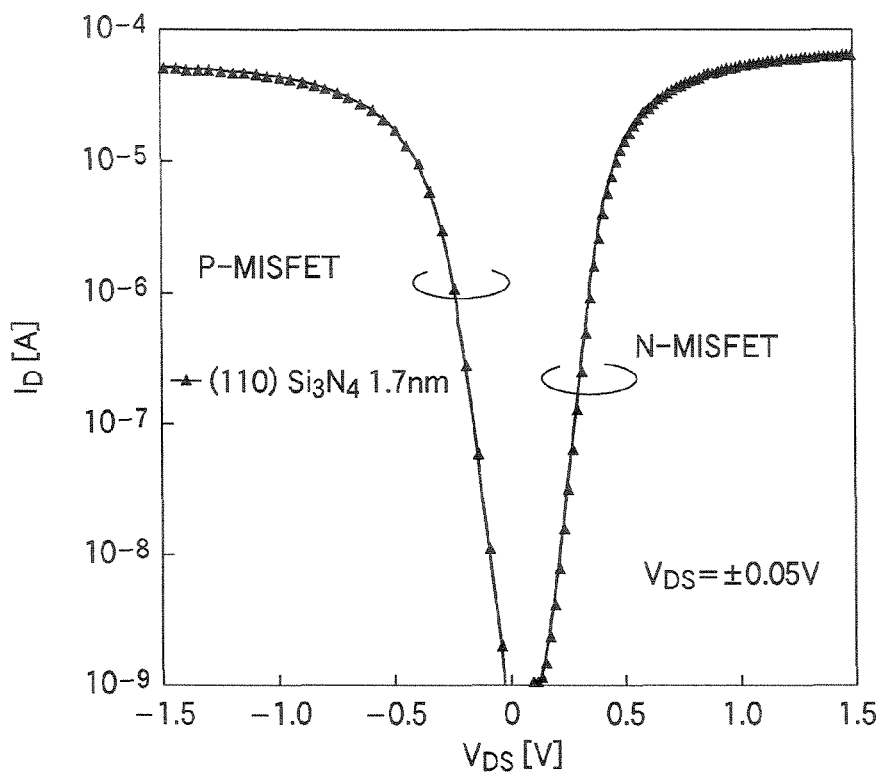
[FIG. 13] This is a graph showing the $V_G$-$I_D$ characteristics of the MISFETs for evaluation.

FIG. 13 shows the $V_G$-$I_D$ characteristics when the drain current ($I_D$) was normalized by the film thickness of the insulating film. FIG. 13 indicates that in MISFET-110, the drain current ($I_D$) was large on the high-voltage side, and the leakage was small on the low-voltage side.

Figure 14:
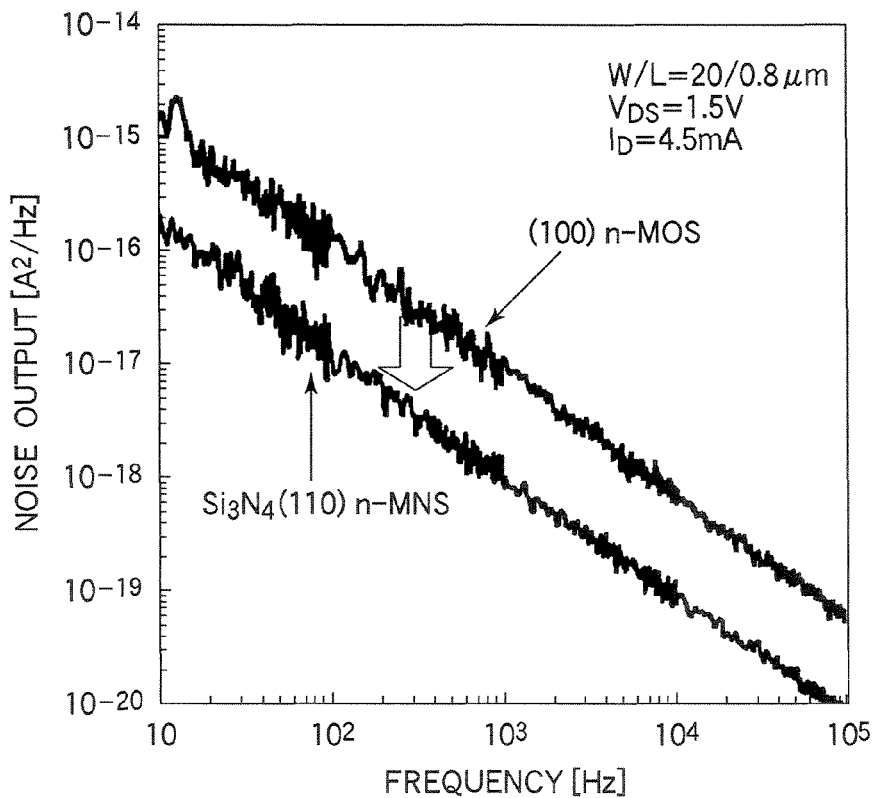
[FIG. 14] This is a graph showing a comparison of the 1/f noise characteristics of a MOSFET for evaluation and the MISFET for evaluation.

FIG. 14 shows the results of a comparison of the 1/f noise characteristics of MISFET-110 and a MOSFET (to be referred to as "MOSFET-100" hereinafter) for evaluation using the silicon oxide film on the Si (100) surface as a gate insulating film. A silicon nitride film is generally inferior to a silicon oxide film in noise characteristics because the number of defects in the former is larger than that in the latter. However, FIG. 14 reveals that the 1/f noise of MISFET-110 was about 1/10 that of MOSFET-100, i.e., MISFET-110 was superior to MOSFET-100 in noise characteristics.

Figure 15A:
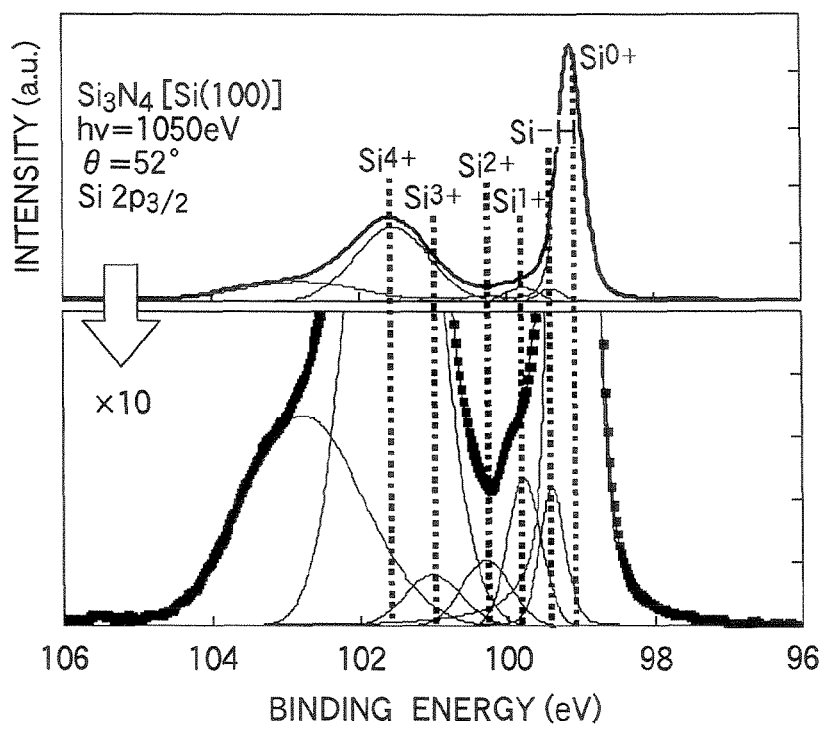
[FIG. 15A] This is a view showing profiles obtained by XPS analysis of the Si $2p^{3/2}$ of a silicon nitride film formed on the Si (100) surface.
Figure 15B:
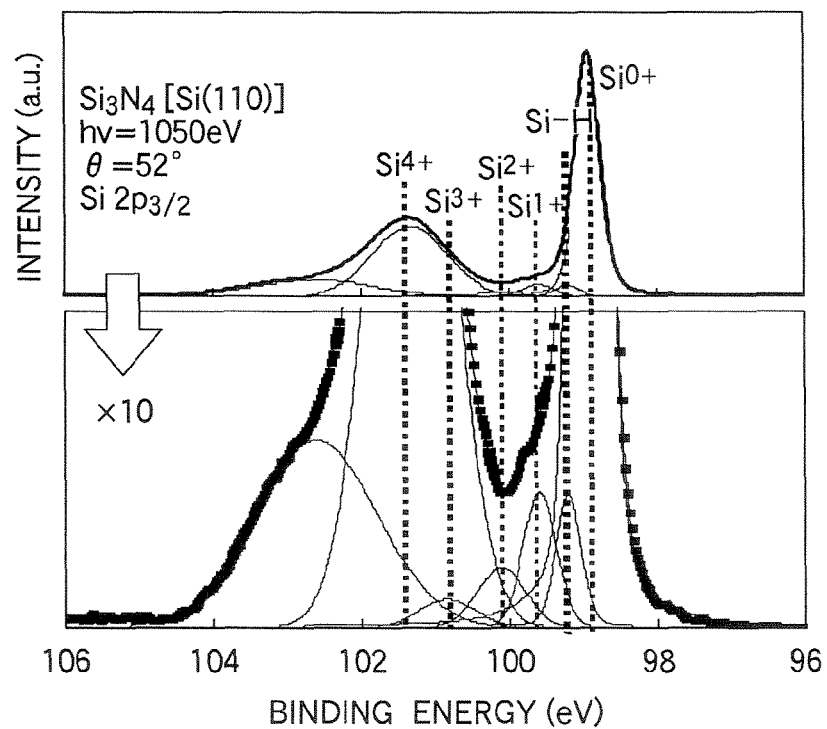
[FIG. 15B] This is a view showing profiles obtained by XPS analysis of the Si $2p^{3/2}$ of a silicon nitride film formed on the Si (110) surface.

The results of examination performed on the interface structures of silicon nitride films by XPS analysis will be explained below. FIG. 15A shows profiles obtained by XPS analysis of the Si $2p^{3/2}$ of a silicon nitride film formed on the Si (100) surface. FIG. 15B shows profiles obtained by XPS analysis of the Si $2p^{3/2}$ of a silicon nitride film formed on the Si (110) surface. Referring to FIGS. 15A and 15B, $Si^{0+}$, $Si^{1+}$, $Si^{2+}$, $Si^{3+}$, and $Si^{4+}$ indicate sub-nitrides of Si. The total amount of $Si^{1+}$, $Si^{2+}$, and $Si^{3+}$ in the silicon nitride film formed on the Si (100) surface was 1.293 monolayer (ML), whereas that in the silicon nitride film formed on the Si (110) surface was as small as 0.781 monolayer (ML). This reveals that, where the plasma nitriding process is performed on the Si (110) surface under the above conditions, a silicon nitride film having a small sub-nitride amount can be formed compared to the case in which a silicon nitride film is formed on the Si (100) surface.

Figure 16:
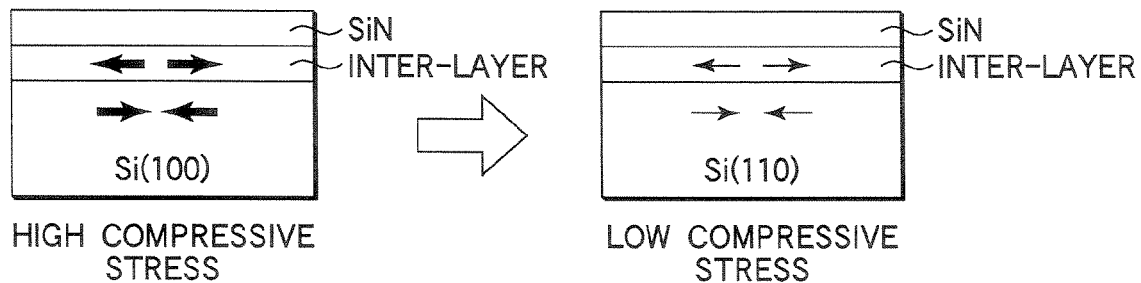
[FIG. 16] This is a schematic view for explaining the difference between the stress (film stress) of a silicon nitride film formed on the Si (110) surface and that of a silicon nitride film formed on the Si (100) surface.

FIG. 16 is a schematic view for explaining the difference between the stress (film stress) of a silicon nitride film formed on the Si (110) surface and that of a silicon nitride film formed on the Si (100) surface. The silicon nitride film formed on the Si (100) surface has a high compressive stress, and hence has a high Si surface density. By contrast, the silicon nitride film formed on the Si (110) surface has a compressive stress lower than that of the silicon nitride film formed on the Si (100) surface, and hence has a low Si surface density. The value is about $9.6\times10^{14}$ [atoms/cm²]. This surface density difference presumably has influence on the difference between the sub-nitride amounts shown in FIGS. 15A and 15B. Also, the surface density difference between the silicon nitride films formed on the Si (110) surface and Si (100) surface probably gives MISFET-110 the superior electrical characteristics as described above.

In the plasma nitriding method of the present invention as has been explained above, a silicon nitride film is preferably formed by performing the plasma nitriding process on a substantially (110) surface of Si rather than the Si (100) surface of silicon. Note that "a substantially (110), surface of Si" means that the surface includes not only the (110) plane but also the (551) plane and the like slightly inclined from the (110) plane.

Figure 17:
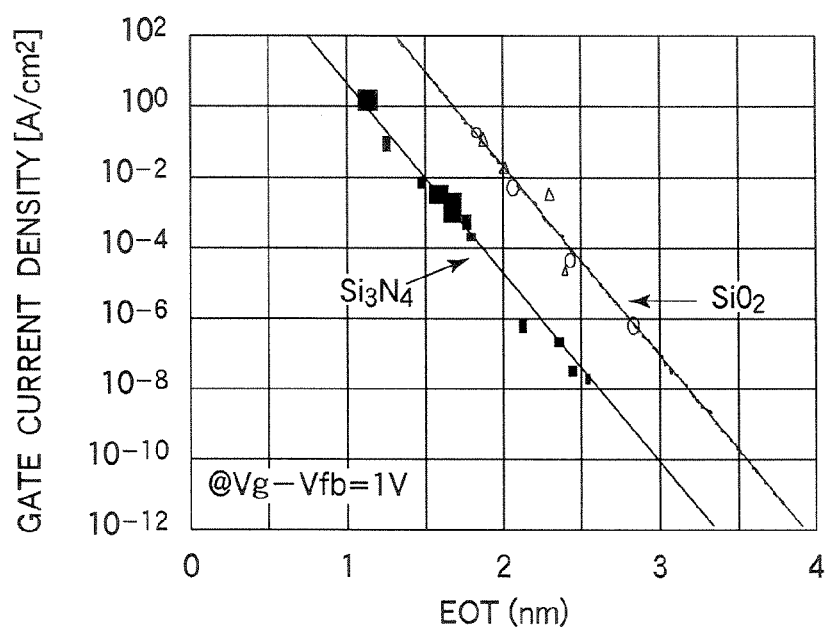
[FIG. 17] This is a graph showing a comparison of the gate current characteristics of transistors for evaluation using a silicon nitride film or silicon oxide film for each of different EOTS.
Figure 18A:
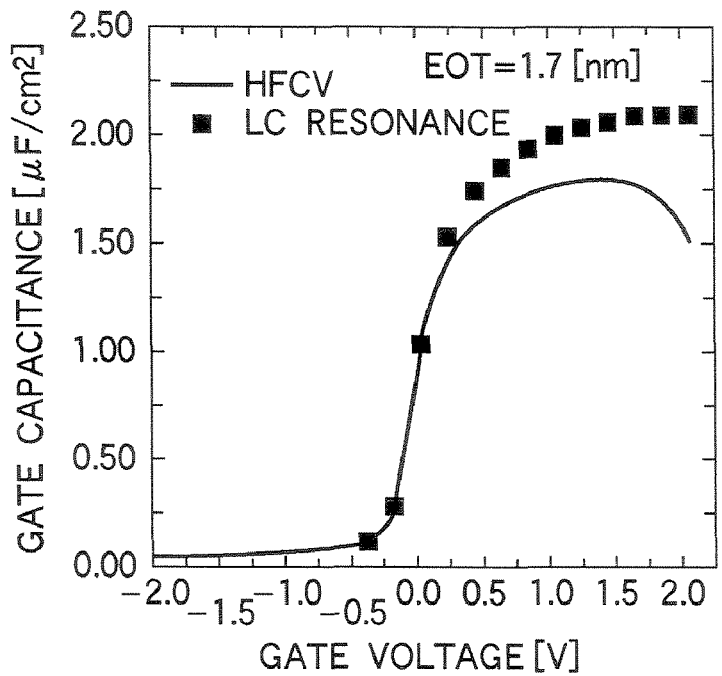
[FIG. 18A] This is a graph showing the results of C-V measurement performed by the LC resonance method on a silicon nitride film having an EOT of 1.7 nm.
Figure 18B:
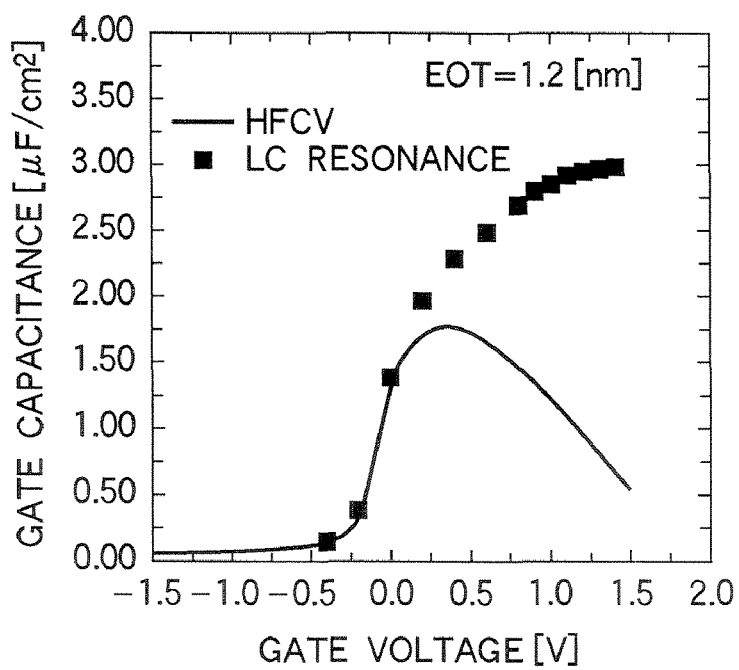
[FIG. 18B] This is a graph showing the results of C-V measurement performed by the LC resonance method on a silicon nitride film having an EOT of 1.2 nm.

FIG. 17 shows the results of a comparison of the gate current characteristics of a transistor for evaluation using a silicon nitride film formed by the method of the present invention, and a transistor for evaluation using a silicon oxide film, for each of different EOTS. Also, FIGS. 18A and 18B illustrate the results of C-V measurement performed by the LC resonance method on transistors for evaluation using silicon nitride films formed by the method of the present invention. FIG. 18A shows the result when the EOT was 1.7 nm, and FIG. 18B shows the result when the EOT was 1.2 nm. The above results demonstrate that the silicon nitride films formed by the method of the present invention had excellent gate current characteristics.

Although the embodiments of the present invention have been described above, the present invention is not limited to the above embodiments and can be variously modified.

For example, FIG. 1 shows the RLSA type plasma processing apparatus 100 as an example. However, the method of the present invention can be similarly practiced in any apparatus capable of generating microwave-excited high-density plasma, as well as in the RLSA type apparatus.

Also, the plasma nitriding method of the present invention is not limited to the case in which a gate insulating film is formed by directly nitriding silicon. For example, the method is also applicable to the case in which the nitriding process is performed on a silicon oxide film [e.g., an $SiO_2$ film thermally oxidized by WVG (Water Vapor Generation) or a plasma-oxidized $SiO_2$ film], a high-k material (e.g., $HfO_2$, $RuO_2$, $ReO_2$, $ZrO_2$, $Al_2O_3$, $HfSiO_2$, $ZrSiO_2$, or a stacked structure of these materials), or the like.

In addition, when forming a composite material of a silicon nitride film and a material (e.g., the above-mentioned high-k material) having a dielectric constant higher than that of the silicon nitride film, a nitriding process can be performed by the plasma nitriding method of the present invention.

Furthermore, the present invention can be used in a nitriding process of a tunnel oxide film in a flash memory, the formation of an ONO film between the floating gate and control gate, and the like.

In the above embodiments, the nitriding process is performed on a semiconductor wafer as a target object. However, the present invention is not limited to the above embodiments. For example, the present invention is applicable to the case in which a target object is a poly-crystalline silicon layer formed on a substrate for a flat panel display (FPD) represented by a liquid crystal display (LCD) As an example, in the manufacturing process of a thin film transistor (TFT), a gate insulating film including a silicon nitride film can be formed by performing a plasma nitriding process by the above method on a poly-crystalline silicon layer or amorphous silicon layer formed on an insulating layer or electrode layer on an FPD substrate such as a glass substrate. The present invention can also be applied to the case in which a target object is a compound semiconductor.

INDUSTRIAL APPLICABILITY

The present invention is preferably usable in various semiconductor device manufacturing processes including a step of forming a silicon nitride film by nitriding silicon.

The invention claimed is:

1. A method for forming a gate insulating film of a semiconductor device, comprising:
   directly nitriding a silicon target layer of a target object to form a silicon nitride gate insulation film on the surface of the silicon target layer;
   wherein the nitriding comprises:
   generating a high-density plasma of a nitrogen-containing gas in an electromagnetic field inside a process container of a plasma processing apparatus, and
   directly introducing N from the high density plasma into the silicon target layer;
   wherein
   the electromagnetic field is generated by supplying microwaves into the process chamber from a planar antenna having a plurality of slots,
   a process temperature of the nitriding is 600° C. to 900° C., and
   a process pressure of the nitriding is 6.7 to 1,333 Pa.

2. The method according to claim 1, further comprising:
   heating the silicon nitride gate insulation film formed on the surface of the silicon target layer at a temperature of not less than 500° C.

3. The method according to claim 1, wherein the silicon of the silicon target layer is single-crystalline silicon having a substantially (110) surface.

4. The method according to claim 1, wherein a film thickness of the silicon nitride gate insulating film is 0.5 to 3 nm.

5. The method according to claim 1, wherein the microwave-excited high-density plasma has a plasma density of $1 \times 10^{10}$ to $5 \times 10^{12}/cm^3$.

6. The method according to claim 1, further comprising:
   performing a heating process at a temperature of from 800° C. to 1,100° C., after the gate insulating film is formed.

7. The method according to claim 1, wherein the nitrogen-containing gas is selected from the group consisting of $NH_3$ gas, a gas mixture of $N_2$ and $H_2$, and hydrazine.

8. The method according to claim 1, wherein the nitrogen-containing gas is $NH_3$ gas.

9. The method according to claim 1, wherein the process pressure of the nitriding process is 20 Pa or higher.

10. The method according to claim 1, wherein the temperature of the nitriding process is 600° C. to 800° C.

11. The method according to claim 2, wherein the temperature of the nitriding process is preset to suppress an increase in intermediate nitride at an interface between the silicon nitride gate insulation film and the silicon target layer during the heating at a temperature of not less than 500° C.

* * * * *